(12) United States Patent  
Into (10) Patent No.: US 6,362,486 B1
(45) Date of Patent: Mar. 26, 2002

(54) MAGNETIC LENS FOR FOCUSING A CHARGED PARTICLE BEAM

(75) Inventor: Stephen W. Into, Harvard, MA (US)

(73) Assignee: Schlumberger Technologies, Inc., San Jose, CA (US)

( * ) Notice: Subject to any disclaimer, the term of this patent is extended or adjusted under 35 U.S.C. 154(b) by 0 days.

(21) Appl. No.: 09/191,102

(22) Filed: Nov. 12, 1998

(51) Int. Cl.⁷ .............................................. H01J 37/141
(52) U.S. Cl. ................. 250/396 ML; 250/398
(58) Field of Search ..................... 250/396 ML, 396 R, 250/398

(56) References Cited

U.S. PATENT DOCUMENTS

| | | | |
|---|---|---|---|
| 4,419,581 A | | 12/1983 | Nakagawa ........... 250/396 ML |
| 4,831,266 A | * | 5/1989 | Frosien et al. ....... 250/396 ML |
| 5,038,045 A | * | 8/1991 | Rouberol et al. .... 250/396 ML |
| 5,241,176 A | | 8/1993 | Yonezawa .................. 250/310 |
| 5,412,209 A | * | 5/1995 | Otaka et al. .......... 250/396 ML |
| 5,729,022 A | * | 3/1998 | Vencklasen et al. . 250/396 ML |
| 6,002,135 A | * | 12/1999 | Vencklasen et al. . 250/396 ML |

FOREIGN PATENT DOCUMENTS

WO 99/53517 10/1999

OTHER PUBLICATIONS

Patent Abstracts of Japan, vol. 1997, No. 04, Apr. 30, 1997 & JP 08 321472 A (Hitachi Ltd), Dec. 3, 1996.

Patent Abstracts of Japan, JP 03–218043, Sep. 25, 1991.

* cited by examiner

*Primary Examiner*—Bruce Anderson
(74) *Attorney, Agent, or Firm*—Frishauf, Holtz, Goodman, Langer & Chick, P.C.

(57) ABSTRACT

A magnetic lens focuses a charged particle beam generated by an instrument to a very small spot for deriving characteristics of a sample. A magnetic flux pattern is created which provides improved high resolution. The lens includes a polepiece with an inner yoke, an outer yoke and a winding. A lens outer pole is secured to the outer yoke and includes a first surface having a first opening defined therein positioned such that the beam passes therethrough. A lens inner pole is secured to the inner yoke and includes a second surface having a second opening defined therein aligned with the first opening, but with a smaller inner diameter.

25 Claims, 7 Drawing Sheets

FIG. 1

PRIOR ART

FIG.2

PRIOR ART

MAGNETIC LENS FOR FOCUSING A CHARGED PARTICLE BEAM

FIELD OF THE INVENTION

The invention is directed to a magnetic lens for focusing a charged particle beam generated by an instrument to a very small spot for deriving characteristics of a sample and, in particular, to create a magnetic flux pattern which provides improved high resolution.

BACKGROUND OF THE INVENTION

Various instruments are known which rely on interaction of charged particles from a sample to derive characteristics of the sample. Examples of such instruments are an electron microscope and a focused ion beam microscope. A focused beam of charged particles is also used in a machine for conducting electron beam lithography.

For facilitating the description of the present invention, it will be explained in connection with a scanning electron microscope ("SEM"). However, it should be understood that the invention is not limited to an SEM and can be applied by one with ordinary skill in the art to instruments and machines such as those mentioned above which require a focused beam of charged particles.

An SEM operates by generating a primary scanning electron beam that impacts a sample, a surface of which is being imaged. As a result, backscattered and secondary electrons are emitted from the sample surface and collected by a detector which is arranged near the surface of the sample. The detector generates a signal from the electron emission collected from the sample surface as it is exposed to the electron beam. The signal from the detector is used to display an image of the surface on a video screen.

Figure 1:
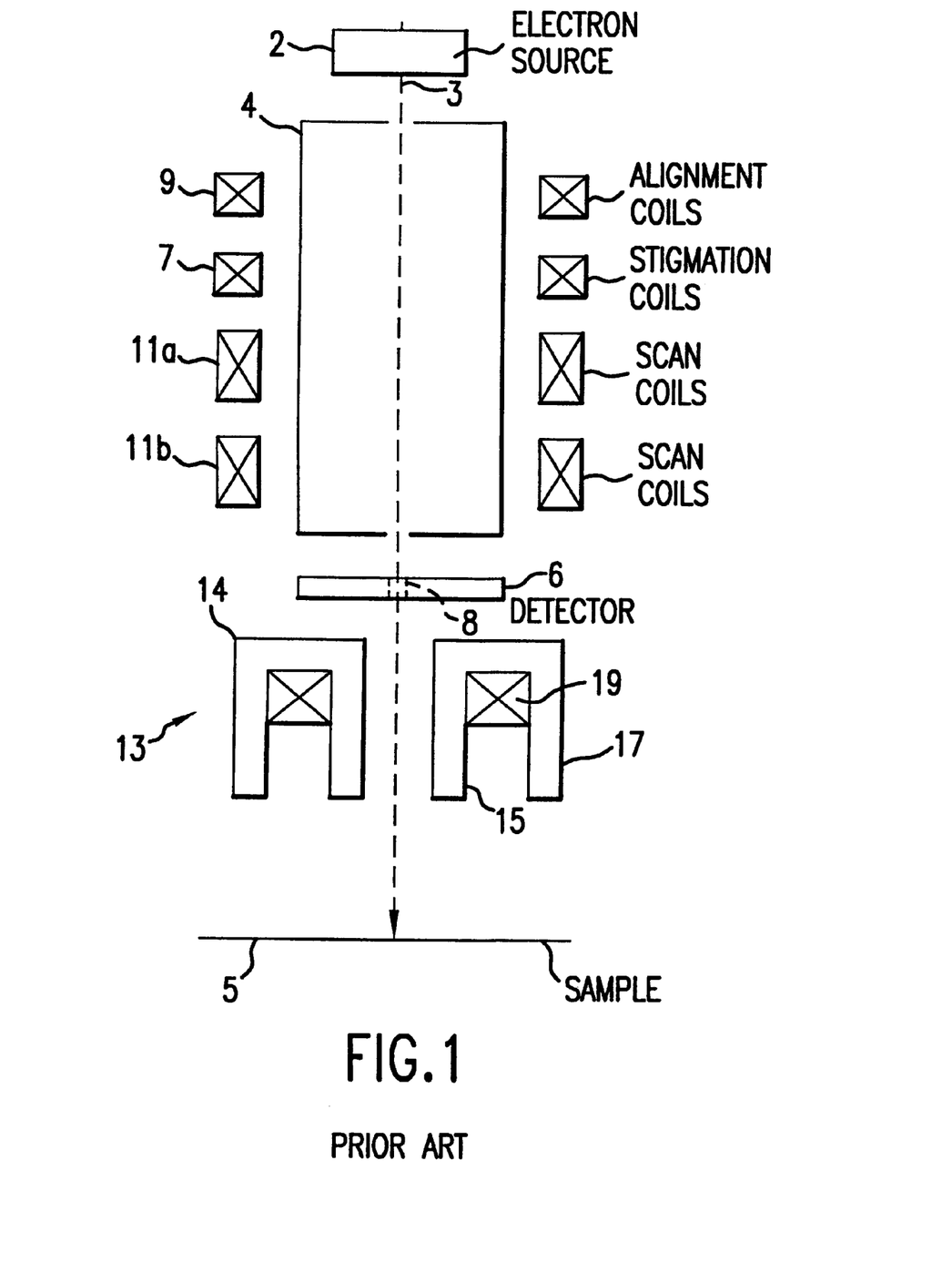
FIG. 1 is a schematic cross-section of a prior art SEM.

A typical arrangement of the main components of an SEM is schematically shown in FIG. 1. Electron source 2 generates an electron beam 3 which is directed through aligned openings at opposite ends of tube 4 toward sample 5. Detector 6 collects electrons emitted from sample 5. Beam 3 passes through opening 8 in detector 6. Beam 3 is controlled by stigmation coils 7, alignment coils 9, scan coils 11a and 11b, and lens 13. The function of these components is well known. Briefly, stigmation coils 7 are used to correct the shape of the beam. Alignment coils 9 are used to align the beam through the tube 4. Scan coils 11a and 11b deflect electron beam 3 in two directions, respectively, such as along an x-direction and a y-direction in a plane perpendicular to the beam direction. SEM's can contain more than one of any of these components.

Electromagnetic lens 13 is provided for focusing of the beam 3 to a very small spot to enable high resolution imaging. One type of lens 13 is an immersion lens. U.S. Pat. No. 5,493,116 discloses an immersion lens, and that lens is shown schematically in FIGS. 1 and 2 hereof. It includes a toroidal, channel-shaped magnetic polepiece 14 with a lens inner pole 15 and a lens outer pole 17, and a winding 19 inside the channel.

One characteristic of an SEM lens is its electron-optical working distance ("E.O."). The E.O. refers to the distance between the surface plane of sample 5 and a plane corresponding to a region of maximum flux density of the lens. The region of maximum flux density for lens 13 is located at plane 22. The E.O. is described as being slightly negative by approximately −1 mm, so that the plane of sample 5 is above the plane 22. This configuration is alleged to have the beneficial result of considerably increasing the collection efficiency of low-yield backscattered electrons because electrons are swept by this slightly negative E.O. onto the detector (or detectors), such as the electron shown as having an initial trajectory along path 20, which is at a significant angle from normal, but is deflected and reaches the detector via deflected trajectory 21 (see FIG. 2).

Figure 2:
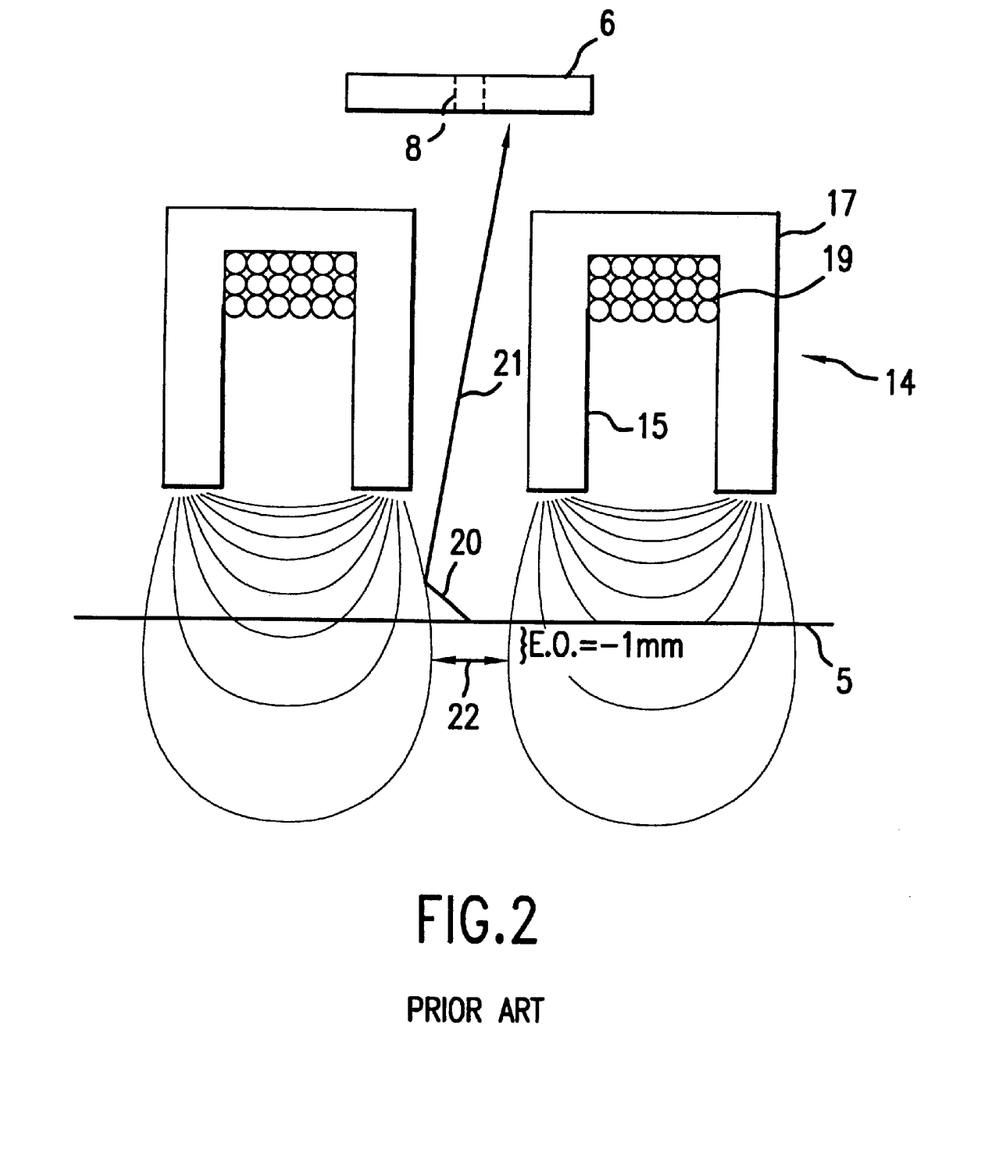
FIG. 2 shows an expanded view of the lens from FIG. 1 with a depiction of the magnetic flux pattern it generates.

A shortcoming of this prior art approach, however, is that the magnetic field, as shown in FIG. 2, interacts with the sample and anything below the sample in the SEM if they have magnetic properties, such as the x-y stage (not shown) which is used to move the sample to its desired scanning position relative to the electron beam. Such interaction causes the field to become distorted. In fact, it is not as shown in FIG. 2, and this deteriorates the resolution achievable with the instrument. In addition, the flux below the sample serves no useful purpose, but power is consumed to generate it. Power used to create this flux generates heat which then has to be conducted away from the coil winding 19. Furthermore, aberrations in generating the small spot can be minimized by creating a magnetic flux pattern which has a concentration of magnetic field near the sample. Since this prior art approach does not produce such a field, higher aberration coefficients can be expected.

A pinhole lens is another type of magnetic lens known in the prior art for focusing a charged particle beam. In contrast to the immersion lens, the bulk of the magnetic field generated by a pinhole lens is above the sample (i.e. it has a positive E.O.). A shortcoming of this lens is that it has a high focal length which interferes with attaining a high resolution. Also, on-axis and near on-axis electrons cannot pass through this field and, therefore, the detector must be positioned below the lens. This further increases the focal length and exacerbates the difficulty in attaining high resolution. Moreover, a detector located in that position can collect only electrons which are substantially off-axis, thereby losing the other electrons.

SUMMARY OF THE INVENTION

One object of the invention is to provide a magnetic lens which produces improved focusing of a beam of charged particles.

Another object of the invention is to provide a magnetic lens which produces improved high resolution imaging.

A further object of the invention is to provide a charged particle lens for imaging which exhibits reduced aberration coefficients.

Yet another object of the invention is to provide a magnetic lens which does not waste power.

Still another object of the present invention is to provide a magnetic lens having a magnetic field which does not interact strongly with the sample and things below the sample.

One other object of the invention is to create desirable lens properties for a magnetic lens while allowing emitted electrons to efficiently reach the detector.

These and other objects are attained in accordance with one aspect of the present invention directed to a magnetic lens for an instrument which directs a charged particle beam toward a sample. A polepiece includes an inner yoke, an outer yoke and a winding. A lens outer pole is secured to the outer yoke and includes a first surface having a first opening defined therein positioned such that the beam passes therethrough. A lens inner pole is secured to the inner yoke and includes a second surface having a second opening defined therein aligned with the first opening, but with a smaller inner diameter.

DETAILED DESCRIPTION OF THE PREFERRED EMBODIMENTS

Figure 3:
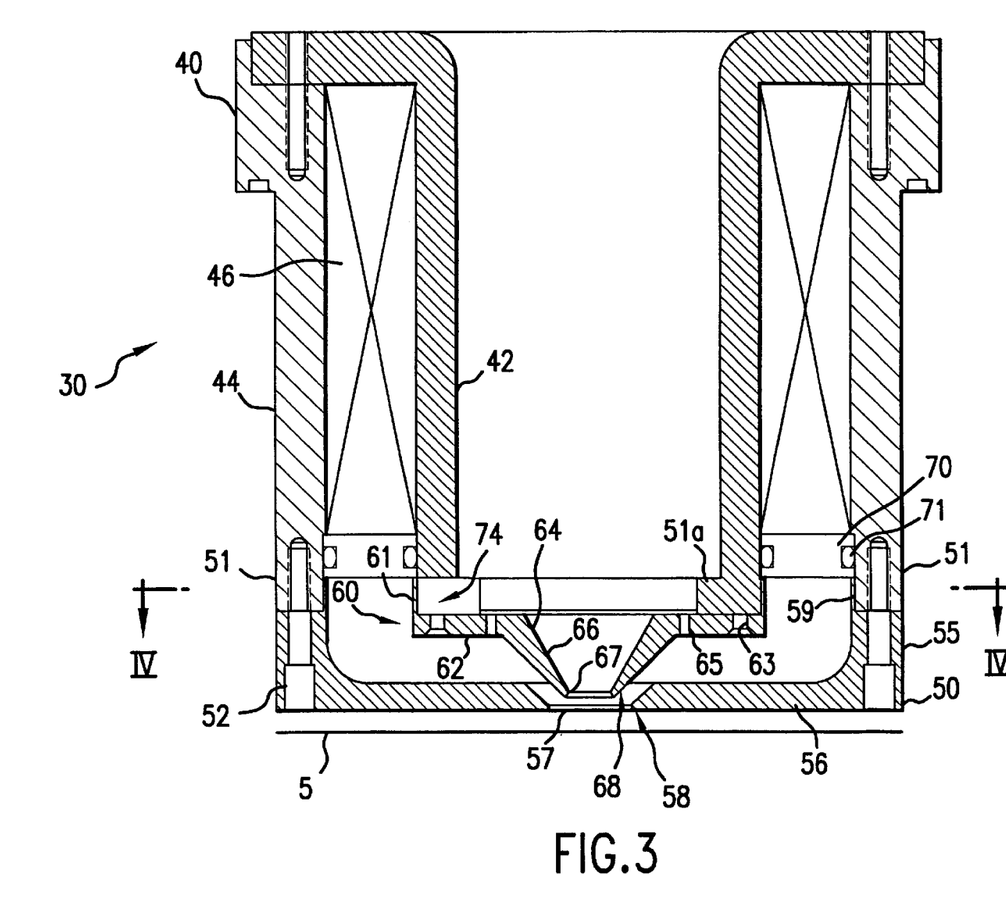
FIG. 3 shows a cross-section taken along lines III—III in FIG. 4 of a lens in accordance with the invention.

FIG. 3 shows a cross section of a lens 30 in accordance with the present invention. Magnetic lens 30 has a toroidal, channel-shaped magnetic polepiece 40. Polepiece 40 has an inner yoke 42, an outer yoke 44, and a winding 46 inside the channel. The manner with which these components are mounted within the SEM is well known and, thus, no details are deemed necessary.

Turning now to the specific features of the lens which embody the principles of the present invention, the inner and outer yokes 42 and 44 are provided with poles 60 and 50, respectively that project toward sample 5 and serve to create a magnetic flux pattern which focuses beam 3 to a very small spot as it impacts the sample. In particular, and with reference to FIGS. 3 and 4, attached to the bottom end 51 of outer yoke 44 is lens outer pole 50. Pole 50 has a cylindrical outer part 55 and a substantially flat, horizontal inner part 56 lying in a plane which is substantially parallel to sample 5. A flange 59 is at the inner periphery of part 55. Flange 59 facilitates alignment of the part during assembly. In addition, it serves to support seal 70. The O-rings 71 in seal 70 seal the interior of the lens in order to maintain a vacuum, as is well known, without requiring the space occupied by winding 46 to be included in the vacuum. Holes 52 are provided in outer part 55 for attachment of pole 50 to yoke 44 by screws (not shown). A centrally located circular opening 57 is defined in inner part 56 by edge 58. Edge 58 is tapered in a manner described in detail below. Pole 50 can be made of any material with magnetic properties sufficient to carry the flux required for operating the lens.

Figure 4:
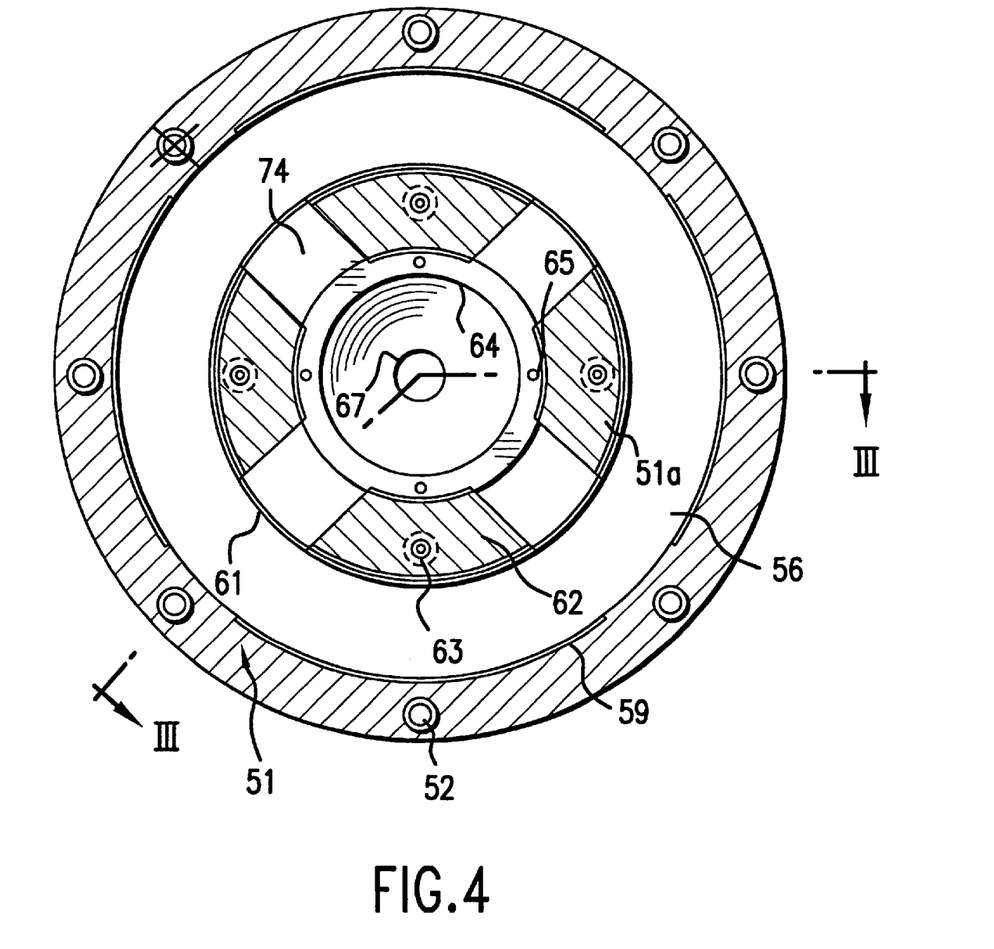
FIG. 4 shows a cross-sectional view taken along line IV—IV in FIG. 3.

Attached to the bottom end 51a of inner yoke 42 is lens inner pole 60 which has a flange 61 at the upper, outer periphery of a substantially flat, horizontal outer part 62 which lies in a plane substantially parallel to sample 5. Flange 61 facilitates alignment of the part during assembly. In addition, it serves to support seal 70. Holes 63 are formed through part 62 to attach pole 60 to yoke 42 by screws (not shown). Horizontal part 62 also includes holes 65 which secure a detector (not shown) in position. The inner part 66 of pole 60, beginning at the I.D. 64 of outer part 62 angles down toward sample 5 and has a central circular opening 67 defined by edge 68. Opening 67 is smaller than and concentric with opening 57. The angled inner part 66 tapers down to edge 68. Inner part 66 is tapered in a manner described in detail below. Edge 68 lies in a plane above inner part 56 of pole 50, as further explained below. Circumferential gaps 74 are provided to permit air to pass out during pumpdown while creating a vacuum. Also, the gaps 74 accommodate wiring for the detector. The gaps should be arranged symmetrically to avoid creating aberrations, although some departure from perfect symmetry can be tolerated.

Figure 5:
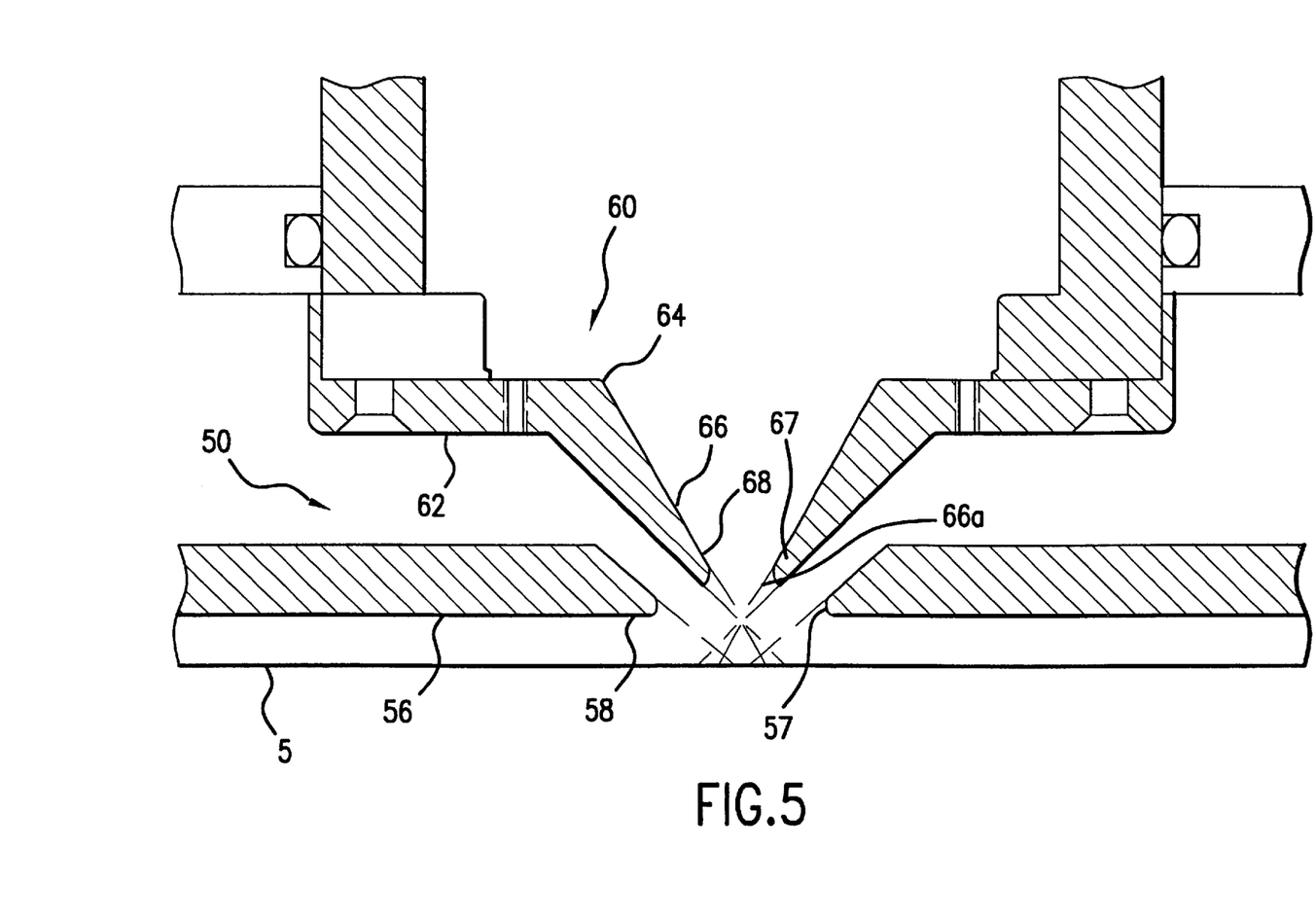
FIG. 5 shows an expanded view of a portion of the lens from FIG. 3.

FIG. 5 provides more detail regarding the lens outer pole 50 and lens inner pole 60. The I.D. 64 of pole 60 is selected to enable all electrons emitted through a wide angle from normal (i.e. the on-axis direction) to reach the detector. The I.D. of opening 67 and the angle for the cone of inner part 66 of pole 60 are selected based on this consideration of enabling emitted electrons to reach the detector. Another way of describing this physical arrangement is that the virtual extension of the inner surface of part 66 along line 66a reaches the area of sample 5 which is being imaged by the beam.

Once these dimensions and configurations are established for lens inner pole 60, lens outer pole 50 is configured to create a magnetic field by suitable positioning and sloping relative to pole 60. More specifically, pole 50 cannot be so close to pole 60 as to extinguish the magnetic field. A certain gap must be provided. Since inner part 66 angles down toward sample 5, the taper of the upper surface of edge 57 and the taper of the lower surface of inner part 66 form a uniform gap of a selected distance between poles 50 and 60. However, the gap need not be uniform because the uniformity of the gap has little effect on the flux pattern which influences the beam. Also, the extension of the tapered surface of edge 58 with virtual lines, as shown in FIG. 5, reaches approximately the same spot on the sample as virtual extension 66a.

The diameter of opening 67 must be smaller than the diameter of opening 57 so that the flux pattern emanates down toward sample 5. Opening 67 of pole 60 is located in a plane above opening 57 of pole 50. This results in raising the region of maximum flux density created by the lens. The diameter of opening 67 affects the focal length and the field profile generated by the lens. Thus, a larger diameter produces a longer focal length, and vice versa. Also, increasing this diameter while keeping the diameter of opening 57 unchanged raises the region of maximum flux density.

Figure 6:
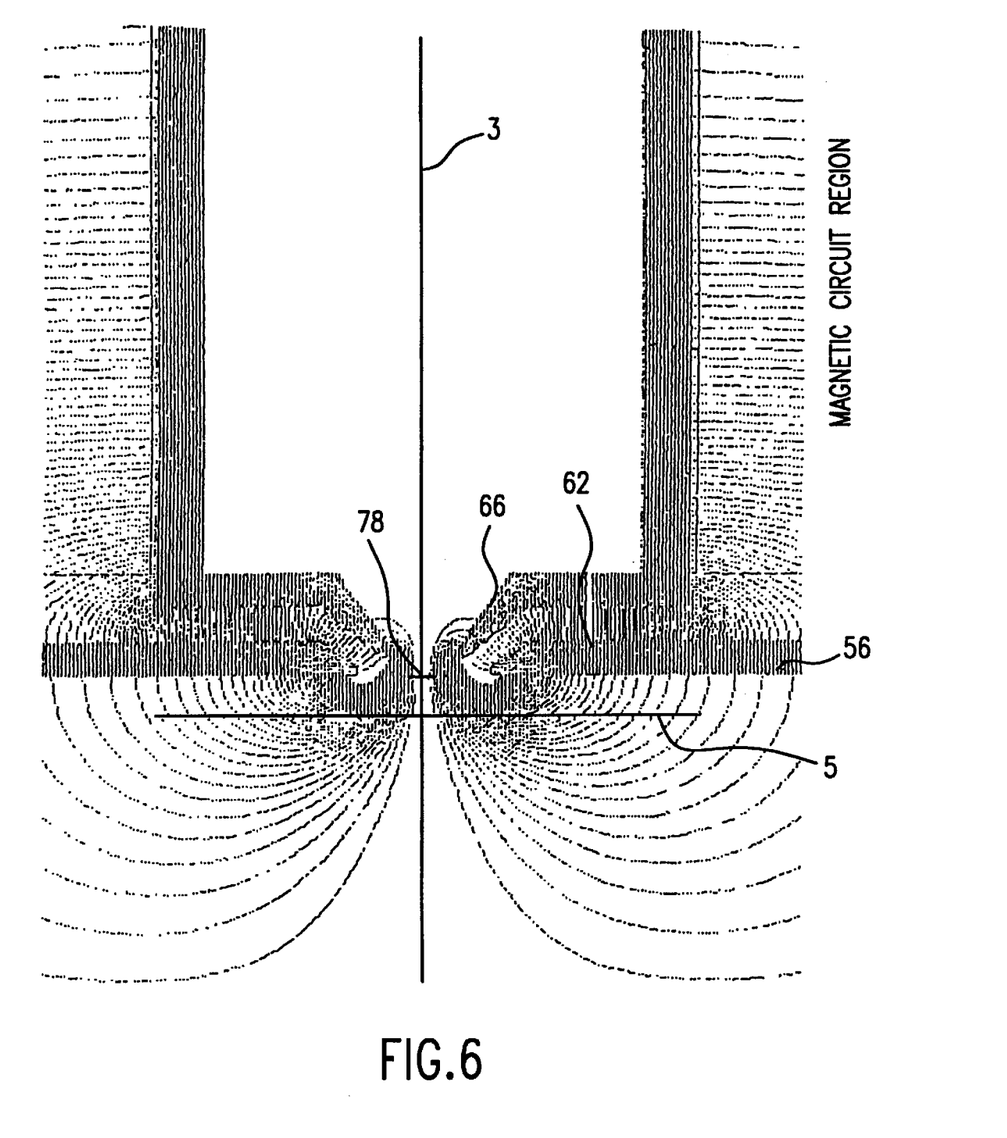
FIG. 6 shows a portion of the lens from FIG. 3 with a depiction of the magnetic flux pattern it generates.

FIG. 6 shows the magnetic flux pattern produced by lens 30, and how that flux pattern is positioned relative to sample 5. A plane 78 corresponding to a region of maximum flux density is created by the lens. Plane 78 should be between the bottom of the lens (e.g. the bottom surface of part 56) and the sample surface. This creates a positive E.O. in that the plane of sample 5 is below the plane 78. The plane 78 can be raised when interaction of the magnetic field emanating from the lens with the sample and/or materials below the sample is undesirable. However, by adjusting the size and positioning of the lens components, plane 78 can also be lowered, even to the extent of a negative E.O., when that is found desirable, such as to control the path of electrons emitted from the sample.

Figure 7:
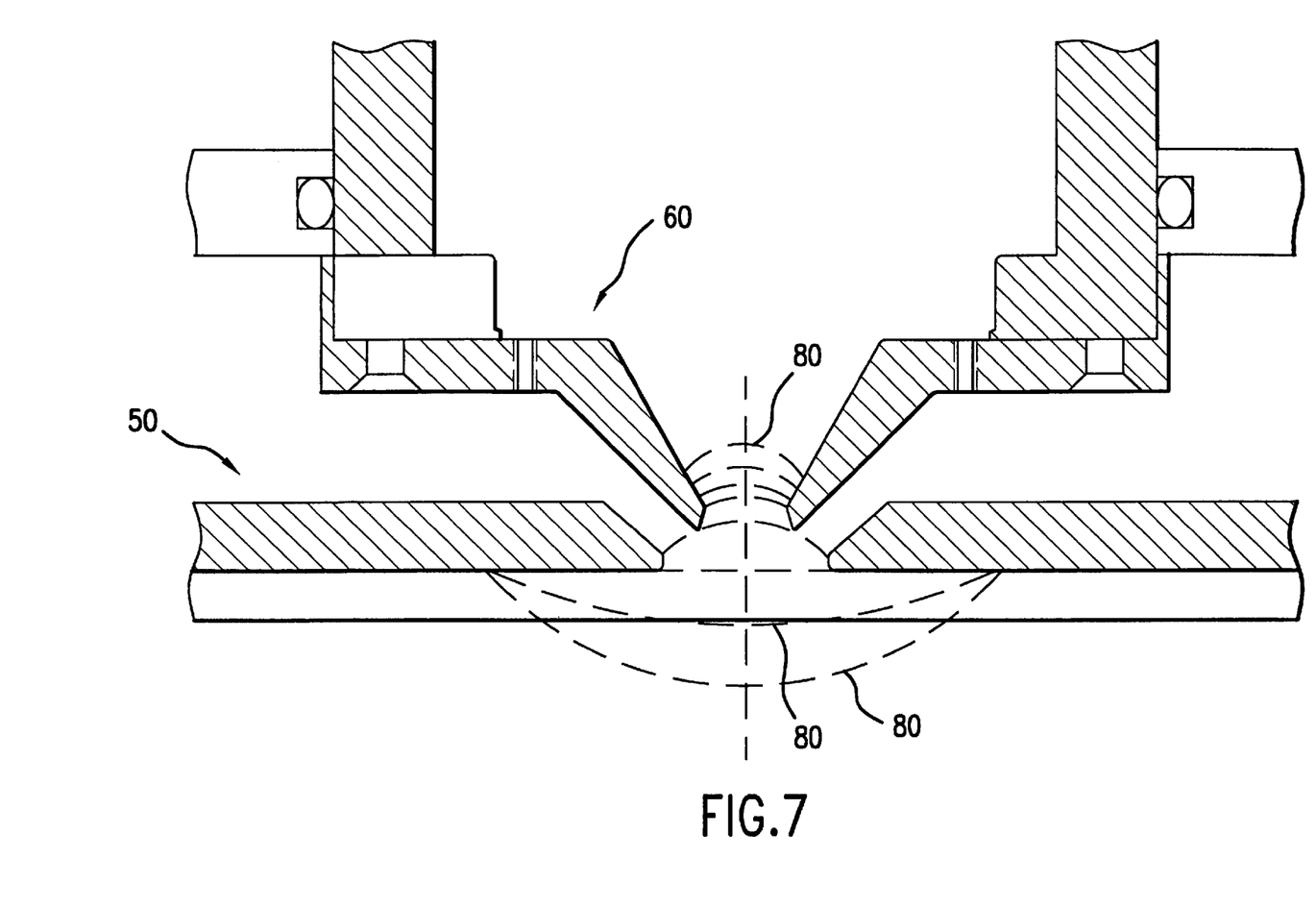
FIG. 7 is a view similar to FIG. 5 and including a depiction of equipotential lines for the magnetic flux pattern of FIG. 6.

This configuration according to the invention has several beneficial results. The magnetic field reaches sample 5 to effectively focus the beam, but only an insignificant portion of the field extends below the sample. This avoids interaction of the field with samples and components below the sample which could distort the field and adversely affect the resolution. Also, the magnetic flux pattern has a concentration of magnetic field near the sample. FIG. 7 depicts the equipotential lines 80 of the flux which demonstrate a well behaved flux pattern that leads to low aberration coefficients. Such a field can be created using less power which effectively reduces the generation of heat.

Although a preferred embodiment of the present invention has been discussed in detail above, various modifications thereto will be readily apparent to anyone with ordinary skill in the art. For example, dimensions such as height and angles can be changed. Scaling of the dimensions is also possible. The planes of 56, 62 need not be flat nor parallel to sample 5. Also, well known electrostatic techniques can be applied in combination with the magnetic lens properties described herein. These and all other such variations are intended to fall within the scope of the present invention as defined by the following claims.

I claim:

1. A magnetic lens for an instrument which directs a charged particle beam toward a sample, comprising:
   a toroidal, channel-shaped polepiece including an inner yoke, an outer yoke and a winding;
   a lens outer pole secured to said outer yoke and including a first surface having a first opening defined therein positioned such that the beam passes therethrough;
   a lens inner pole secured to said inner yoke and including a second surface having a second opening defined therein aligned with said first opening, but with a smaller inner diameter.

2. The magnetic lens of claim 1, wherein an edge defining said first opening is tapered.

3. The magnetic lens of claim 1, wherein an edge defining said second opening is tapered.

4. The magnetic lens of claim 1, wherein said second opening is further from the sample than said first opening.

5. The magnetic lens of claim 1, wherein at least a portion of the second surface surrounding said second opening is conical.

6. The magnetic lens of claim 1, wherein at least a portion of the first surface surrounding said first opening is planar.

7. The magnetic lens of claim 1, wherein an edge defining said second opening extends at least partly into said first opening.

8. The magnetic lens of claim 1, wherein an edge defining said first opening is separated from an edge defining said second opening by a gap.

9. A magnetic lens for focusing a charged particle beam to derive characteristics of a sample, comprising:
   a toroidal, channel-shaped magnetic pole piece having an inner yoke and an outer yoke;
   a winding in a channel of said pole piece;
   a lens inner pole secured to said inner yoke having an outer part and an inner part, said inner parts having a first opening defined therein by a wall extending and tapered toward the sample;
   a lens outer pole, secured to said outer yoke, having a second opening defined therein aligned with said first opening.

10. The magnetic lens of claim 9, wherein an inner surface of the wall defining said first opening is at such an angle that a virtual extension thereof reaches an area of the sample imaged by a beam.

11. The magnetic lens of claim 10, wherein the first and second openings are centrally located relative to the polepiece.

12. The magnetic lens of claim 11, wherein said second opening is larger than said first opening.

13. The magnetic lens of claim 12, wherein said first opening is further from the sample than said second opening.

14. The magnetic lens of claim 13, wherein a surface defining said second opening is angled toward the sample.

15. The magnetic lens of claim 14, wherein the surface defining said second opening is angled toward the sample at such an angle that a virtual extension thereof reaches said area of the sample imaged by a beam.

16. The magnetic lens of claim 14, wherein a lower edge defining a bottom of said first opening extends at least partly into said second opening.

17. The magnetic lens of claim 14, wherein a portion of an inner surface of the wall which defines said first opening and is closest to the sample has a constant radius to form a cylindrical inner surface.

18. The magnetic lens of claim 9, wherein said second opening is larger than said first opening.

19. The magnetic lens of claim 9, wherein said first opening is further from the sample than said second opening.

20. The magnetic lens of claim 9, wherein a surface defining said second opening is angled toward the sample.

21. The magnetic lens of claim 9, wherein a surface defining said second opening is at such an angle that a virtual extension thereof reaches said area of the sample imaged by a beam.

22. The magnetic lens of claim 9, wherein a portion of an inner surface of the wall which defines said first opening and is closest to the sample has a constant radius to form a cylindrical inner surface.

23. The magnetic lens of claim 9, wherein said extending wall is substantially entirely conical.

24. The magnetic lens of claim 9, wherein said second opening is defined by a surface of the lens outer pole which is spaced by a predetermined gap from an outer surface of said extending wall.

25. A method of focusing a charged particle beam to derive characteristics of a sample with the magnetic lens of claim 24, comprising the steps of:
   establishing a designated magnetic field by selecting said gap between the surface defining said second opening in said lens outer pole and the outer surface of said extending wall; and
   positioning the first and second openings relative to the sample such that a region of maximum flux density created by the magnetic lens is located in a plane which is at a predetermined location relative to the sample.

* * * * *